United States Patent [19]
Jung et al.

[11] Patent Number: 5,858,820
[45] Date of Patent: Jan. 12, 1999

[54] THIN FILM TRANSISTOR-LIQUID CRYSTAL DISPLAY AND A MANUFACTURING METHOD THEREOF

[75] Inventors: Byung-Hoo Jung, Seoul; Yong-Suk Jin, Kyungki-do; Joo-Hyung Lee; Chang-Won Hwang, both of Seoul, all of Rep. of Korea

[73] Assignee: Samsung Electronics Co., Ltd., Kyungki-do, Rep. of Korea

[21] Appl. No.: 649,517

[22] Filed: May 17, 1996

[30]    Foreign Application Priority Data

May 17, 1995 [KR]   Rep. of Korea ................... 1995 12232
May 17, 1995 [KR]   Rep. of Korea ................... 1995 12241

[51] Int. Cl.⁶ ........................... H01L 21/00; H01L 21/84; H01L 21/20; H01L 21/36
[52] U.S. Cl. ........................... 438/150; 438/166; 438/486
[58] Field of Search ..................... 438/149, 150, 438/151, 164, 166, 482, 158, 486; 257/347, 352, 353, 354

[56]         References Cited

U.S. PATENT DOCUMENTS

| | | | |
|---|---|---|---|
| 5,318,919 | 6/1994 | Noguchi et al. | 437/41 |
| 5,389,580 | 2/1995 | Miyasaka | 438/150 |
| 5,508,216 | 4/1996 | Inoue | 438/151 |
| 5,531,182 | 7/1996 | Yonehara | 117/7 |
| 5,637,515 | 6/1997 | Takemura | 438/162 |

*Primary Examiner*—Brian Dutton
*Attorney, Agent, or Firm*—Pillsbury Madison & Sutro LLP

[57]              ABSTRACT

The present invention relates to a thin film transistor-liquid crystal display (hereinafter referred to as a TFT-LCD) and a manufacturing method thereof.

An amorphous silicon is deposited on a substrate. The amorphous silicon is transformed into a poly silicon by method of solid phase crystallization, and the first poly silicon layer pattern is formed by etching. An amorphous silicon is deposited on the first poly silicon layer pattern. The amorphous silicon is transformed into a second poly silicon layer by method of solid phase crystallization.

14 Claims, 14 Drawing Sheets

ANNEALING

ION IMPLANTATION

ANNEALING

FIB.7C

THIN FILM TRANSISTOR-LIQUID CRYSTAL DISPLAY AND A MANUFACTURING METHOD THEREOF

BACKGROUND OF THE INVENTION

1. Field of the Invention

The present invention relates to a thin film transistor-liquid crystal display (hereinafter referred to as a TFT-LCD) and a manufacturing method of the same.

2. Description of the Related Art

A conventional TFT-LCD consists of a gate electrode, an insulating layer, a semiconductor layer, a source/drain electrode, a passivation layer, and a pixel electrode layer.

Amorphous silicon is generally used as the semiconductor layer. The amorphous silicon has a mobility in the range of 0.5–1.0 [cm$^2$/Vsec]. However, the mobility of the amorphous silicon is too low to drive a TFT, since the mobility needed for driving a TFT is 50–150 [cm$^2$/Vsec].

Therefore, a TFT using amorphous silicon must have a driving IC outside of a liquid crystal panel to drive the TFT. But using a driving IC is troublesome. Accordingly, it would be preferable for TFTs to use a semiconductor layer made from poly silicon, which has a high mobility of around 50–150 [m$^2$/Vsec].

A poly silicon TFT preferably has grains that are large. It is also desirable that the grains and the space between the grains do not have defects, and that the surface has minimal roughness.

In attempting to obtain these characteristics, fabrication sequences for semiconductor layer of a conventional poly silicon TFT-LCD will now be described.

FIGS. 1A–2E show cross-sectional views of a fabrication sequence for a conventional poly silicon TFT-LCD.

FIG. 1A illustrates a substrate 102. FIG. 1B illustrates depositing an amorphous silicon 104 on the substrate 102. FIG. 1C shows annealing the amorphous silicon with a temperature in the range of 500°–700° C. to transform the amorphous silicon 104 to a poly silicon 106 having increased grain size. FIG. 1D illustrates patterning the poly silicon 106 to obtain a patterned layer 106A.

Annealing of the patterned poly silicon 106A is illustrated in FIG. 1E, with a temperature in the range of 800°–1100° C. to obtain patterned poly silicon layer 106B having improved crystallization characteristics.

FIGS. 2A–2F show cross-sectional views of another fabrication sequence for a conventional poly silicon TFT-LCD.

FIG. 2A illustrates a substrate 202, on which there is deposited an amorphous silicon 204, as shown in FIG. 2B. FIG. 2C illustrates depositing a photoresist 205, patterning the photoresist 205, and implanting ions in the amorphous silicon 204. FIG. 2D illustrates annealing the amorphous silicon 204 with a temperature in the range of 500°–700° C. to transform the amorphous silicon 204 to a poly silicon 206 having increased grain size.

FIG. 2E illustrates patterning the poly silicon 206 to obtain a patterned layer 206A, which is then further annealed as illustrated in FIG. 2F with a temperature in the range of 800°–1100° C. to obtain patterned poly silicon 206B having improved crystallization characteristics.

FIGS. 3A–3D show cross-sectional views of another fabrication sequence for a conventional poly silicon TFT-LCD.

FIG. 3A illustrates a substrate 302, on which there is deposited a poly silicon 306, as shown in FIG. 3B. FIG. 3C illustrates implanting ions in the poly silicon 306 and annealing the poly silicon 306 with a temperature in the range of 500°–700° C. FIG. 3D illustrates patterning a poly silicon 306 to obtain a patterned layer 306A.

The above-described conventional poly TFT-LCD is not perfectly crystallized, therefore, additional time is needed for heating and annealing.

SUMMARY OF THE INVENTION

The objective of the present invention is to provide a poly silicon TFT-LCD and a manufacturing method of the same for fully crystallizing an active portion of a semiconductor layer by positioning a seed in a desired position.

In order to achieve the above object, and others, the poly silicon TFT-LCD according to the present invention includes a seed layer pattern which is formed on the substrate.

A silicon layer which is formed by epitaxial growth on the seed layer pattern is fully crystallized due to the presence of the seed layer pattern, so that the crystallization growth pattern begins at the seed layer and occurs outward therefrom.

A method of the above described poly silicon TFT-LCD includes depositing a seed layer on a substrate and then forming a seed layer pattern by etching the seed layer. Thereafter, a silicon layer is deposited over the seed layer. Ions are then implanted in the silicon layer, which is thereafter annealed. Accordingly, a silicon layer having a large grain size is obtained.

In another embodiment, a trench formed in a substrate acts as a seed layer so that a silicon layer having a larger grain size is obtained. A method for manufacturing a poly silicon TFT-LCD according to this embodiment includes forming a trench by etching a substrate and depositing a silicon layer over the substrate and within the trench. Thereafter, annealing of the silicon layer is performed to obtain a larger grain size. The silicon layer is then patterned and etched to form a silicon layer pattern.

In still another embodiment, a method for manufacturing a poly silicon TFT-LCD according to the present invention deposits an amorphous silicon on a substrate. This amorphous silicon is transformed to a poly silicon layer using solid phase crystallization. A seed layer is formed by etching the poly silicon layer. Thereafter, a amorphous silicon is deposited on the poly silicon layer and the amorphous silicon is then transformed to an active poly silicon using solid phase crystallization.

In still another embodiment, a method for manufacturing a poly silicon TFT-LCD according to the present invention deposits a seed layer of amorphous silicon on a substrate and then an active amorphous silicon layer thereon. This amorphous silicon is transformed to a poly silicon layer using a laser to melt completely parts of the active layer which exist on region adjacent the seed layer to form a laser crystallized active region.

The seed layer pattern, in all of the above embodiments can be formed of a singular or multiple patterned portions that are preferably positioned in a location that corresponds with the position of the source and drain electrodes of the TFT-LCD that are part of the silicon layer disposed in order to maximize the grain size of the active portion of the TFT-LCD transistor.

BRIEF DESCRIPTION OF THE DRAWINGS

The preferred embodiment of the present invention will now be described more specifically with reference to the attached drawings, wherein:

FIG. 7A–7E show a cross-sectional view of a fabrication sequence according to a third embodiment of the TFT-LCD according to the present invention.

DESCRIPTION OF THE PREFERRED EMBODIMENT

A preferred embodiment of the present invention will become apparent from a study of the following detailed description, when viewed in light of the accompanying drawings.

Figure 8:
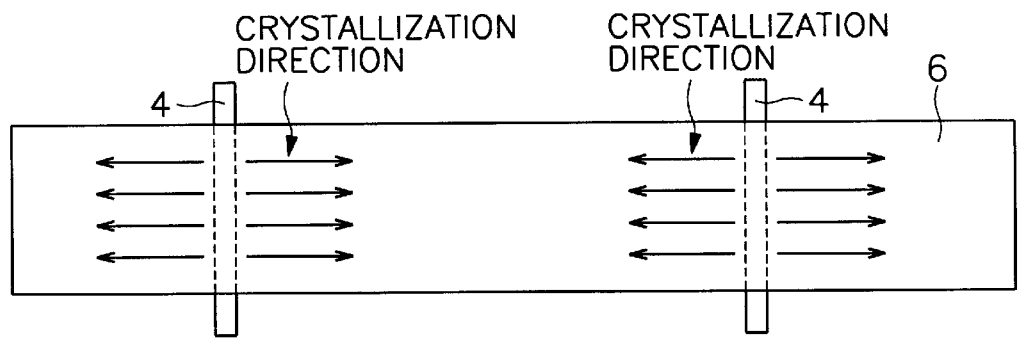
FIG. 8 shows a plan view of the grain growth direction from a seed in accordance with the present invention.
Figure 9:
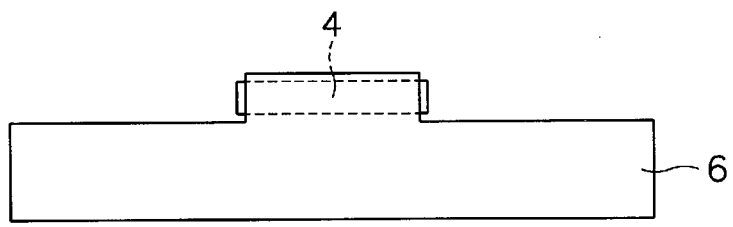
FIG. 9 shows a plan view of a first lay-out of the seed in accordance with the present invention.
Figure 10:
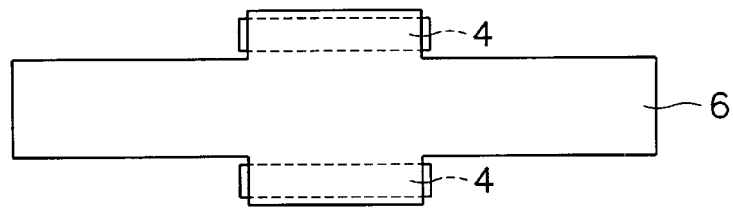
FIG. 10 shows a plan view of a second lay-out of the seed in accordance with the present invention.
Figure 11:
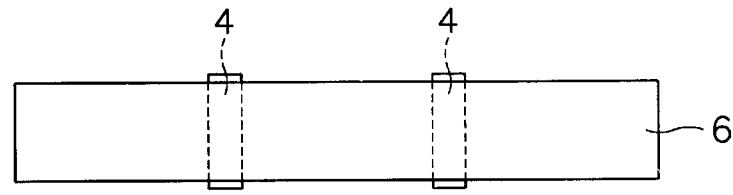
FIG. 11 shows a plan view of a third lay-out of the seed in accordance with the present invention.
Figure 12:
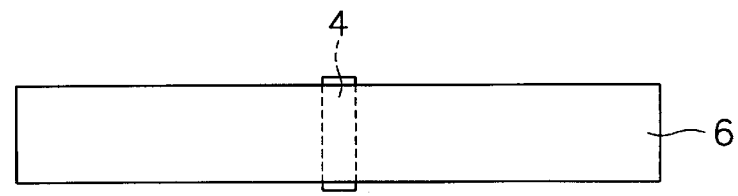
FIG. 12 shows a plan view of a fourth lay-out of the seed in accordance with the present invention.
Figure 13:
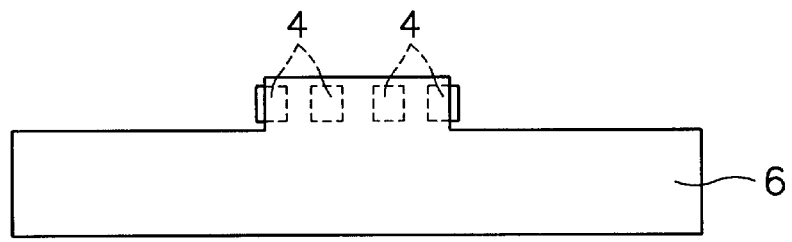
FIG. 13 shows a plan view of a fifth lay-out of the seed in accordance with the present invention.
Figure 14:
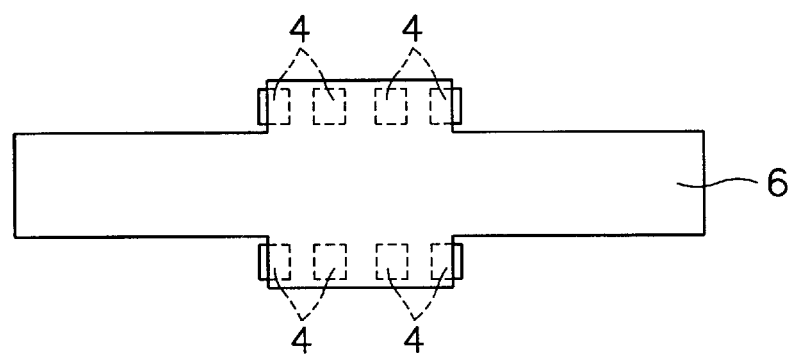
FIG. 14 shows a plan view of a sixth lay-out of the seed in accordance with the present invention.
Figure 15:
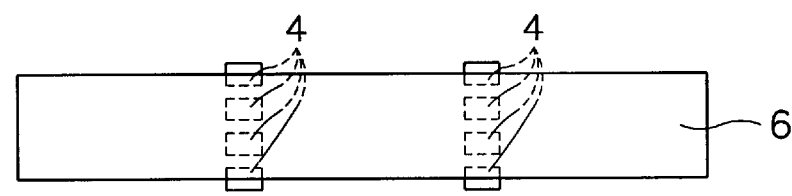
FIG. 15 shows a plan view of a seventh lay-out of the seed in accordance with the present invention.
Figure 16:
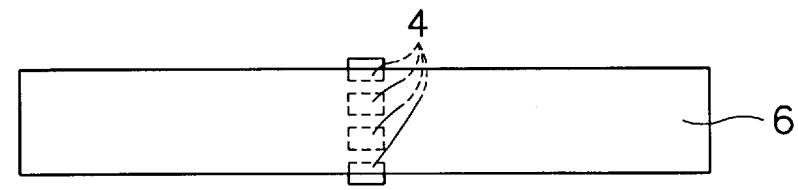
FIG. 16 shows a plan view of an eighth lay-out of the seed in accordance with the present invention.

FIG. 8 illustrates that a silicon layer 6 can be crystallized so that a large grain size is obtained. FIG. 8 illustrates that the direction of grain growth on the silicon layer 6 is outward from the seed layer pattern disposed below. This grain growth initially occurs during epitaxial growth of the silicon layer 6 over the seed layer pattern 4, which grain size is then further enhanced during an annealing step that takes place after formation of the seed layer pattern 4 and the silicon layer 6 as will be described hereinafter.

It should be noted that the seed layer, in all of the embodiments, is preferably formed in a location that corresponds to the source and drain electrodes of the TFT-LCD transistor. After a seed is formed, a crystallized silicon layer is epitaxially grown using the seed. If a seed is annealed at a crystallization temperature, the grain growth occurs without incubation time since a seed is a crystalline structure. Further, crystallization is sped up according to the stress of a silicon layer by the seed. However, a nucleation occurs after incubation time in the part that does not have a seed. Therefore, if the seed of crystalline structure grows before creating nucleation in the part having no seed, the size of the crystalline portion is larger than the original seed. Thus, by locating the seed close to the active region, a larger grain size is obtained in the region of interest.

Figure 1A:
FIGS. 1A–1E show a cross-sectional view of a fabrication sequence for a conventional poly silicon TFT-LCD.
Figure 1B:
Figure 1C:
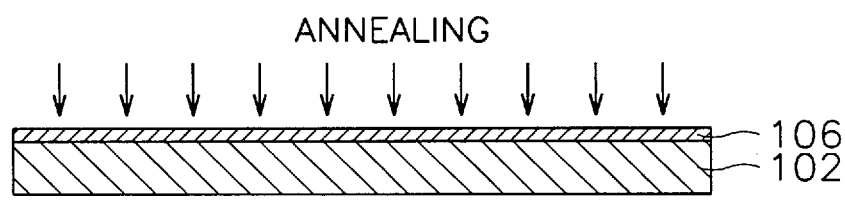
Figure 1D:
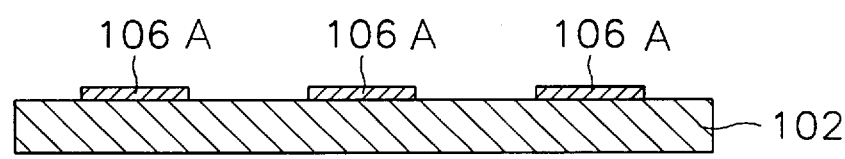
Figure 1E:
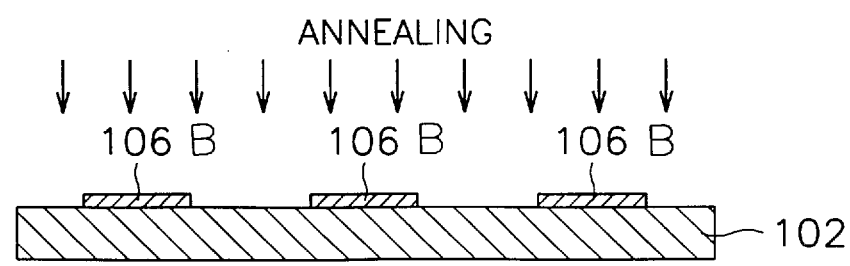
Figure 2A:
FIGS. 2A–2F show a cross-sectional view of a fabrication sequence for a conventional poly silicon TFT-LCD.
Figure 2B:
Figure 2C:
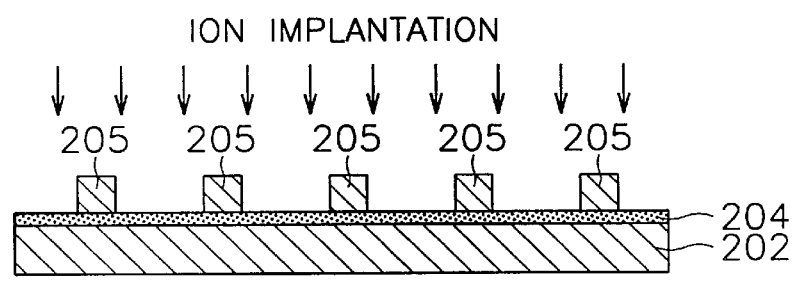
Figure 2D:
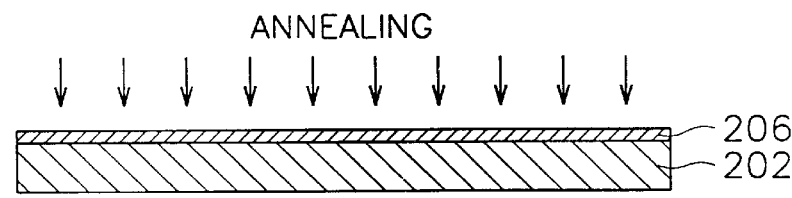
Figure 2E:
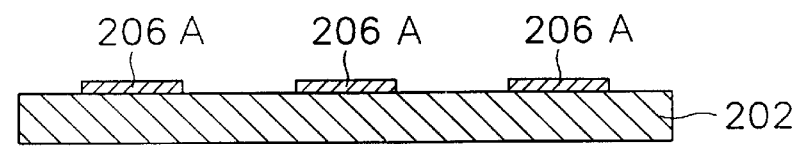
Figure 2F:
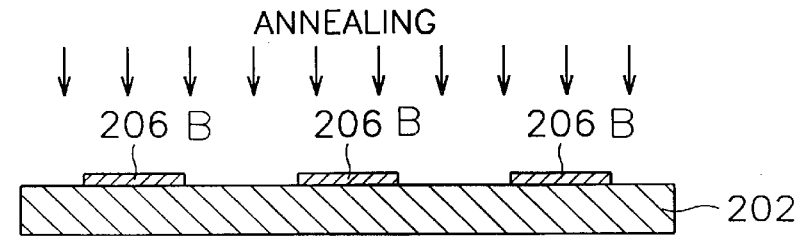
Figure 3A:
FIGS. 3A–3D show a cross-sectional view of a fabrication sequence for a conventional poly silicon TFT-LCD.
Figure 3B:
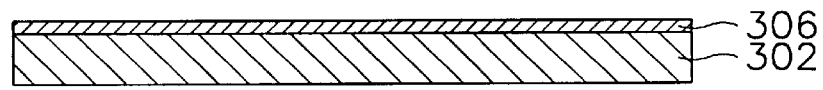
Figure 3C:
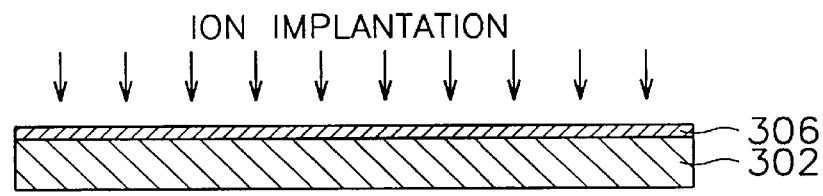
Figure 3D:
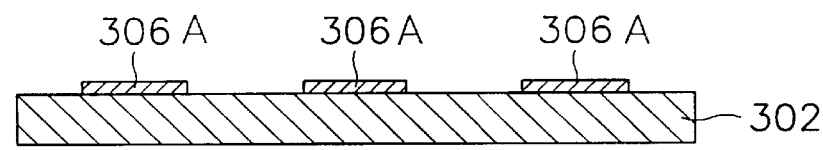
Figure 4:
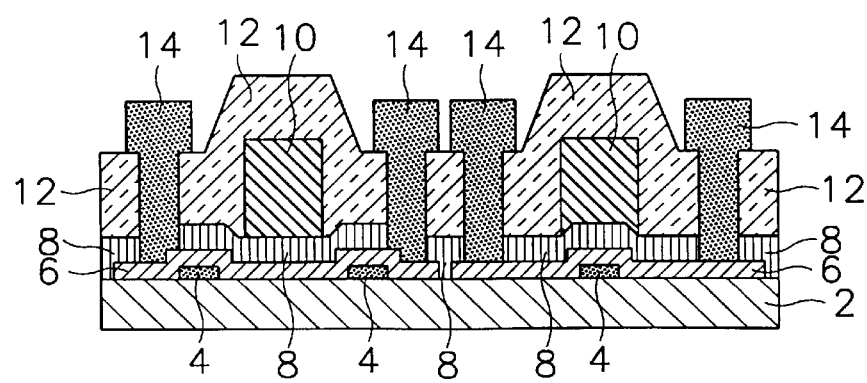
FIG. 4 shows a cross-sectional view of a TFT-LCD according to the present invention.

FIG. 4 illustrates a poly silicon TFT-LCD according to the present invention. A seed layer 4 pattern is formed on substrate 2. A silicon layer 6 is formed on the seed layer 4 pattern. An oxidation layer 8 is formed on the silicon layer 6. A hole in the oxidation layer is used to establish the gate electrode, which gate electrode is electrically insulated from the silicon layer with either a portion of the oxidation layer 8 that is not etched, or a different insulating layer disposed between the silicon layer 6 and the oxidation layer 8.

A gate metal pattern 10 is formed on the oxidation layer 8 and an insulating layer is formed on the gate metal pattern 10. Holes are formed in the insulating layer 12 so that source/drain connections on the silicon layer 6 can be established by the conductor layer 14.

A manufacturing method for producing a poly silicon TFT-LCD according to a first embodiment of the present invention is shown in FIGS. 5A–5H.

Figure 5A:
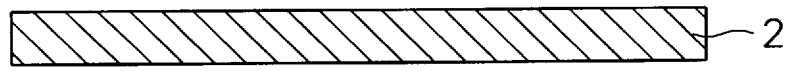
FIGS. 5A–5E show a cross-sectional view of a fabrication sequence according to a first embodiment of the TFT-LCD according to the present invention.
Figure 5B:

As shown in FIGS. 5A–5B, a seed layer 4 is deposited on a substrate 2.

Figure 5C:
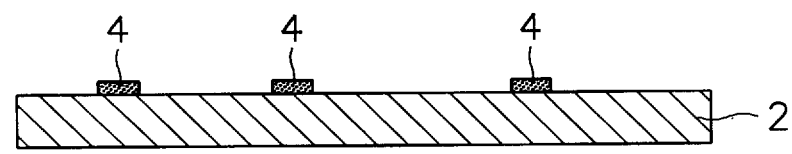
Figure 5D:
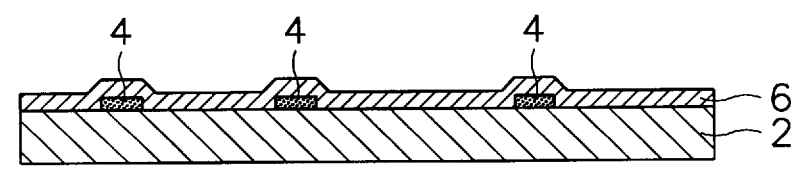

FIG. 5C illustrates a seed layer pattern 4 formed by etching the seed layer 4. Thereafter, a silicon layer 6 is deposited, preferably by epitaxial growth using the seed, as shown in FIG. 5D.

Figure 5E:
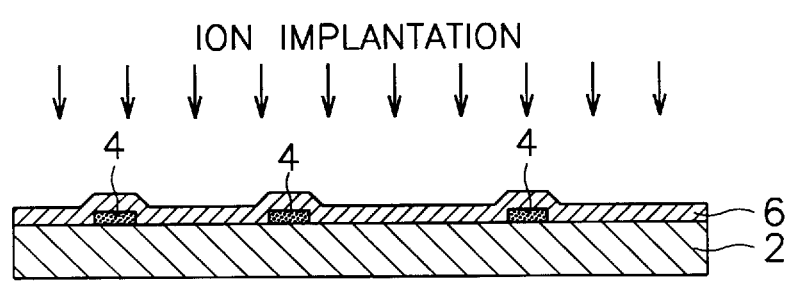

FIG. 5E shows the silicon layer 6 being implanted with ions and is annealed with a temperature in the range of 800–1100 C.

A manufacturing method for producing a poly silicon TFT-LCD according to a second embodiment of the present invention is shown in FIGS. 6A–6F.

Figure 6A:
FIGS. 6A–6K show a cross-sectional view of a fabrication sequence according to a second embodiment of the TFT-LCD according to the present invention.
Figure 6B:
Figure 6C:

As shown in FIGS. 6A–6B, a seed layer 4, made of amorphous silicon or poly silicon or SiGe, is deposited on a substrate 2. The seed layer 4 can be deposited by physical vapor deposition or chemical vapor deposition. FIG. 6C shows a seed layer pattern 4A formed by etching the seed layer 4.

A position of each seed layer pattern 4A is preferably parallel to the source and drain electrode's direction or perpendicular to the source and drain electrode's direction.

Figure 6D:
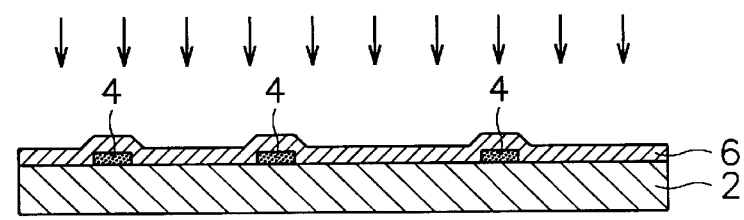

Silicon layer 6 is deposited, annealed and crystallized, as shown in FIG. 6D. The silicon layer 6 can be deposited by physical vapor deposition or chemical vapor deposition.

Figure 6E:
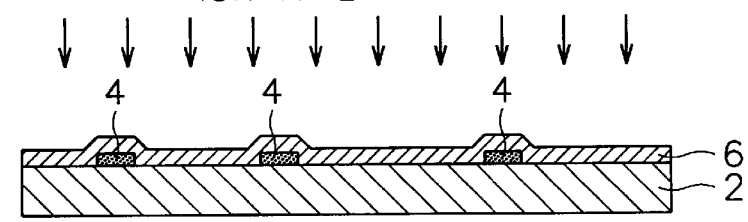

Thereafter, as shown in FIG. 6E, silicon layer 6 is subjected to ion implantation. Ions such as AR, Si, Ne and Kr can be implanted at a −=0–7 degree incident tilt angle at a low beam current (less than or equal to 2.0 mA).

Figure 6F:
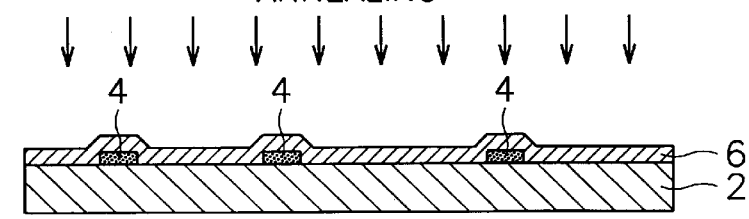

Then, as shown in FIG. 6F, the silicon layer 6 is annealed using a temperature in the range of 500°–700° C.

Figure 6G:
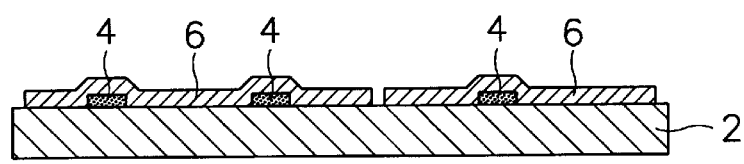
Figure 6H:
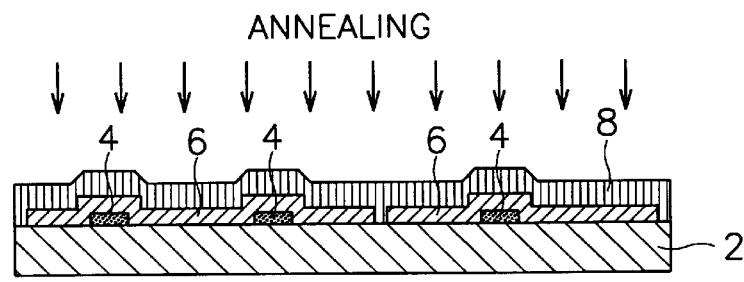

A silicon layer 6 pattern is then formed by etching the silicon layer 6, as shown in FIG. 6G. As shown in FIG. 6H, an oxidation layer 8 is deposited and then this structure is annealed at a temperature in the range of 800°–1100° C. A hole (not shown) is then etched so that correct gate electrode placement can occur.

Figure 6I:
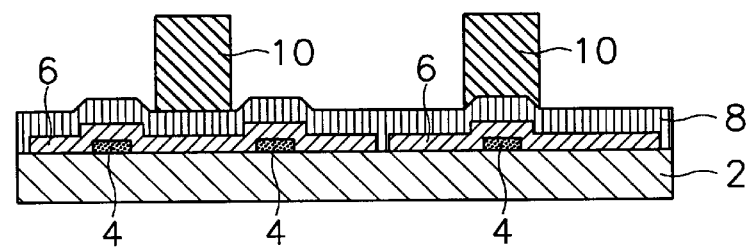
Figure 6J:
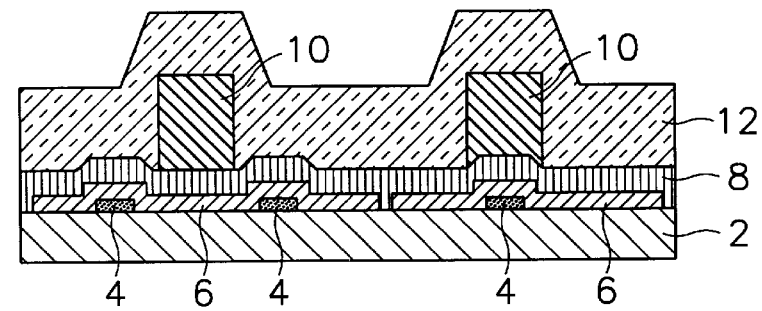

As shown in FIG. 6I, a gate metal 10 is deposited and etched on the oxidation layer 8. Thereafter, as shown in FIG.

Figure 6K:
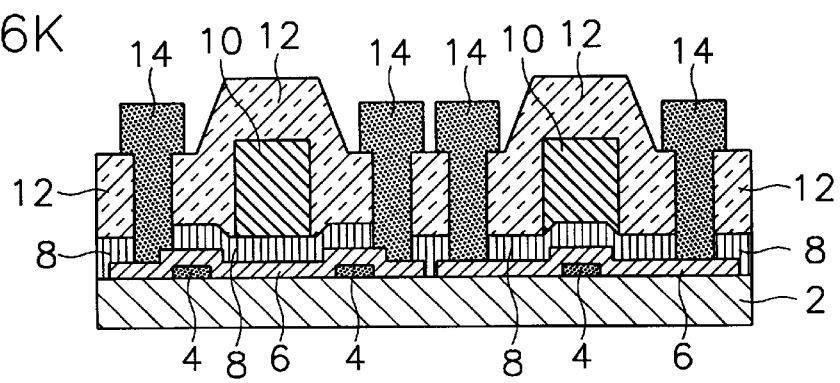

6J, a insulating layer 12 is deposited. Portions of the insulating layer 12 and the oxidation layer 8 are then etched away to form contact holes, and a conductor layer 14 is deposited, so that it establishes appropriate electrical connection in the contact holes to the silicon layer 6, and is then patterned, as shown in FIG. 6K.?

As shown in FIGS. 9–16, the seed layer 4 can be placed in various positions on the silicon layer 6 pattern.

Still another manufacturing method for producing a poly silicon TFT-LCD according the present invention is shown in FIGS. 7A–7E.

Figure 7A:
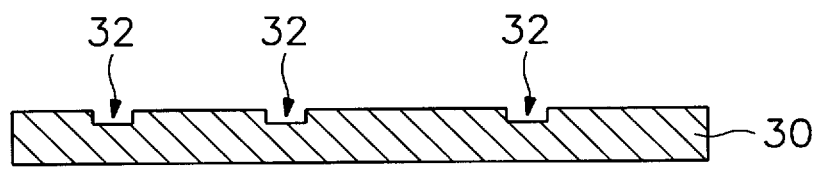
Figure 7B:
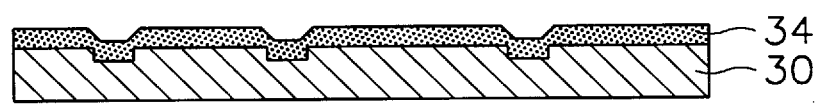
Figure 7B:
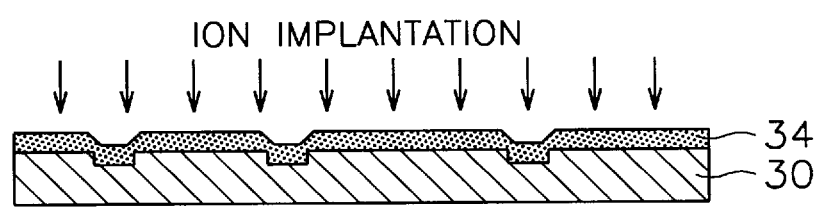

As shown in FIG. 7A, a trench 32 is formed on a substrate 30 by etching and then, as shown in FIG. 7B, a silicon layer 34 is deposited.

Figure 7D:
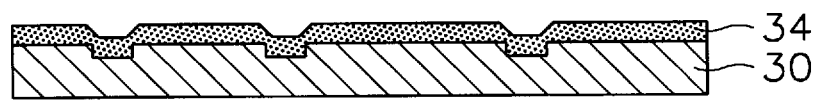
Figure 7E:
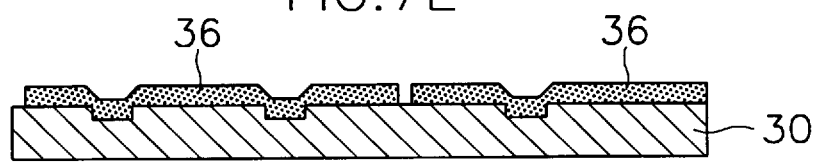

Thereafter, as shown in FIG. 7C, the silicon layer 34 is implanted with ions such as silicon or argon. The silicon layer 34 is annealed with a temperature in the range of 500°–700° C., as shown in FIG. 7D, and then, as shown in FIG. 7E, the silicon layer pattern 36 is formed by etching the silicon layer 34.

Another manufacturing method for producing a poly silicon TFT-LCD according to the present invention is shown in FIGS. 17A–17D.

Figure 17A:
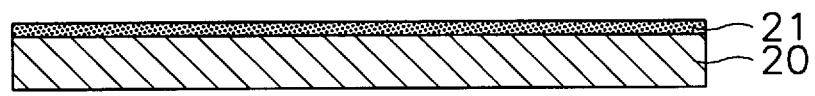
FIGS. 17A–17D show a cross-sectional view of a fabrication sequence for a fourth embodiment of the present invention.
Figure 17B:
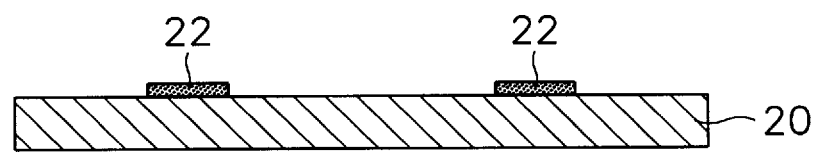
Figure 17C:
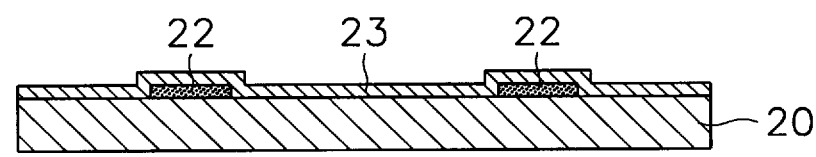
Figure 17D:
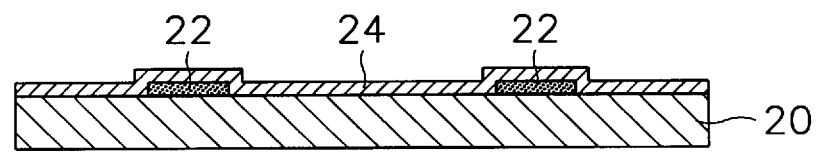
Figure 18:
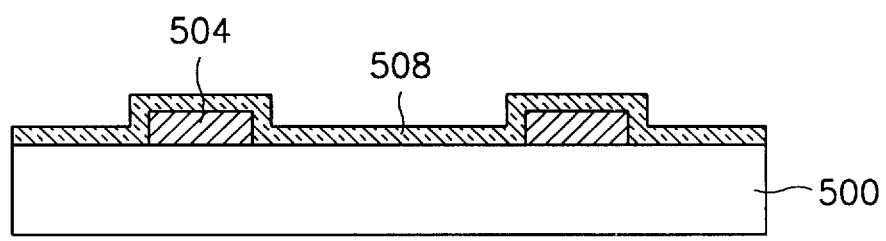
FIG. 18 shows a cross-sectional view of a fifth embodiment of the present invention.

As shown in FIG. 17A, an amorphous silicon 21 is deposited on a substrate 20 and the amorphous silicon 21 is transformed into a poly silicon layer 22 using solid phase crystallization, and the first poly silicon layer 22 is patterned by etching, as shown in FIG. 17B. As shown in FIG. 17C, an amorphous silicon 23 is then deposited on the first poly silicon layer 22 and, as shown in FIG. 17D, the amorphous silicon 23 is transformed into a second poly silicon layer 24 solid phase crystallization.

A method for manufacturing a poly silicon TFT-LCD according to a fifth embodiment of the present invention is shown in FIGS. 18 and 19A–19K.

Figure 19A:
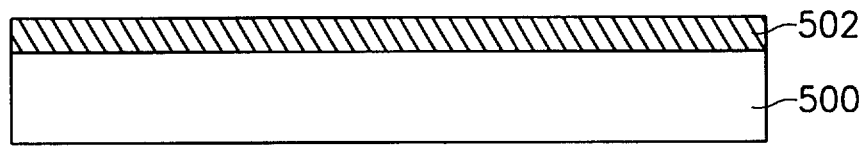
FIG. 19A–19K shows a cross-sectional view of a fabrication sequence for a fifth embodiment of the present invention.
Figure 19B:
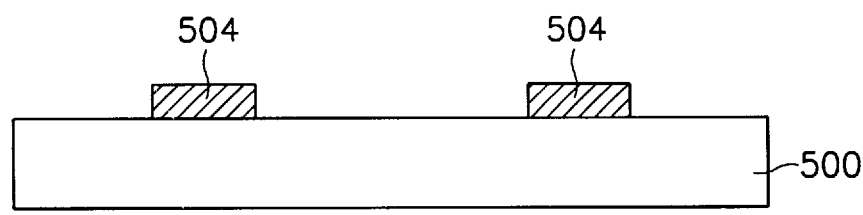

As shown in FIG. 19A–19B, an amorphous silicon 502 is deposited on a substrate 500 with thickness of about 500 to 1000 A and etched to form a seed layer portions 504.

Figure 19C:
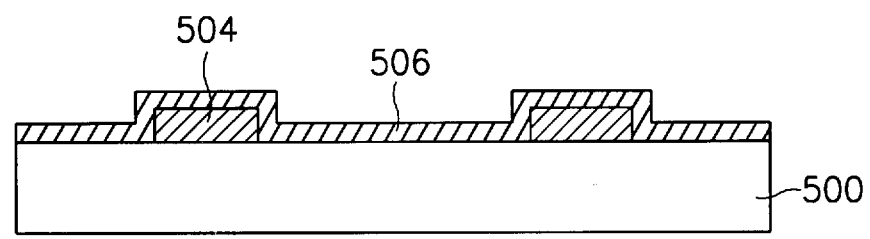

As shown in FIG. 19C, amorphous silicon 506, used as an active layer, is deposited with thickness of about 500 to 1000 A.

Figure 19D:
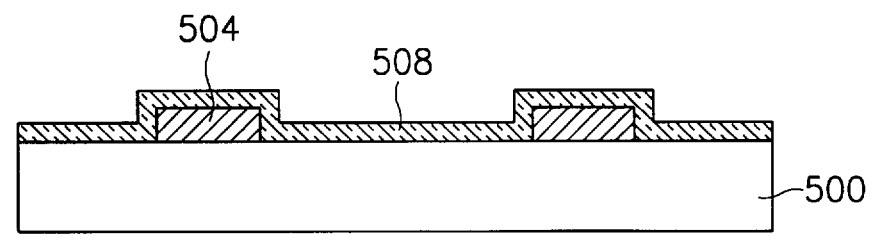
Figure 19E:
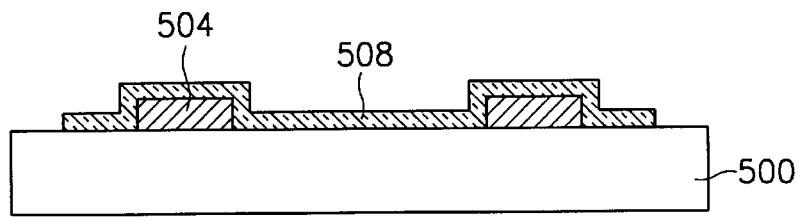
Figure 19F:
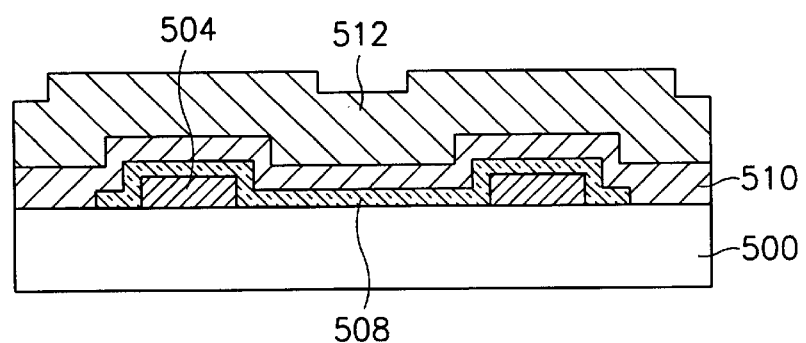
Figure 19G:
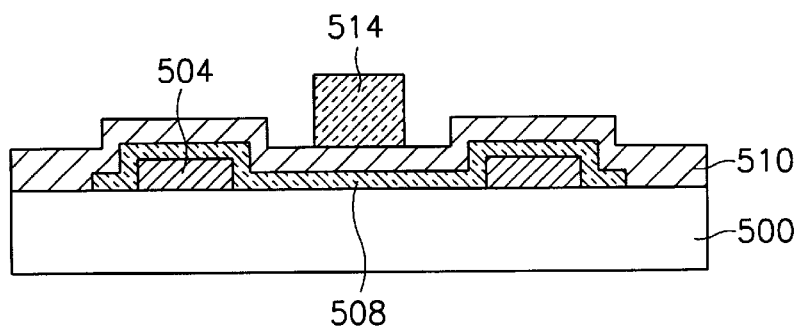

Thereafter, as shown in FIG. 19D, a laser is directed to a portion of the amorphous silicon 506 adjacent seed layer portions 504 to melt such portions completely and to form a laser crystallized active region 508. As shown in FIG. 19E, a laser crystallized active region 508 is etched. Thereafter, as shown in FIGS. 19F–19G, a gate insulating layer 510 made of SiO2 is deposited on the laser crystallized active region 508 with thickness of about 1000 A. A gate metal 512 made of Al is deposited with thickness of about 3000 A and etched to form a gate electrode 514.

Figure 19H:
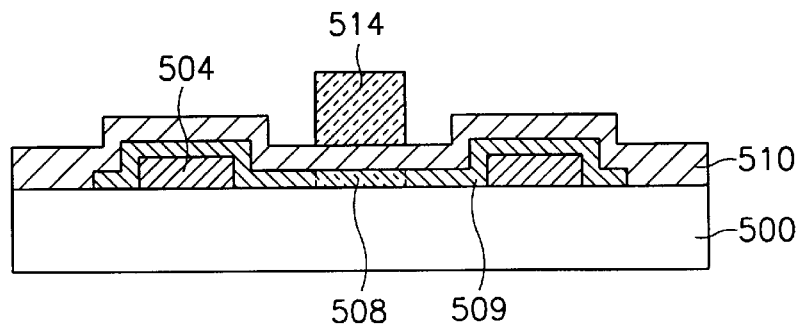
Figure 19I:
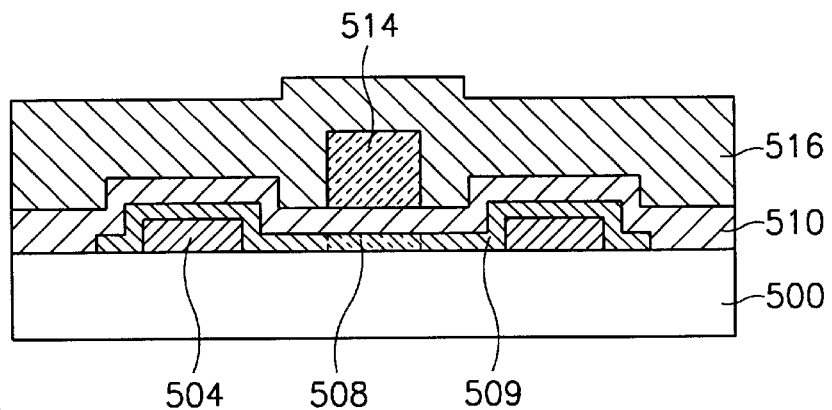

As shown in FIG. 19H, ions are implanted into the laser crystallized active region 508 by using the gate electrode 514 as a mask to form a source/drain electrodes 509. FIG. 19I illustrates that the source/drain electrodes 509 are activated by annealing or laser projection, and an insulating layer 516 is deposited with thickness of about 6000 A.

Figure 19J:
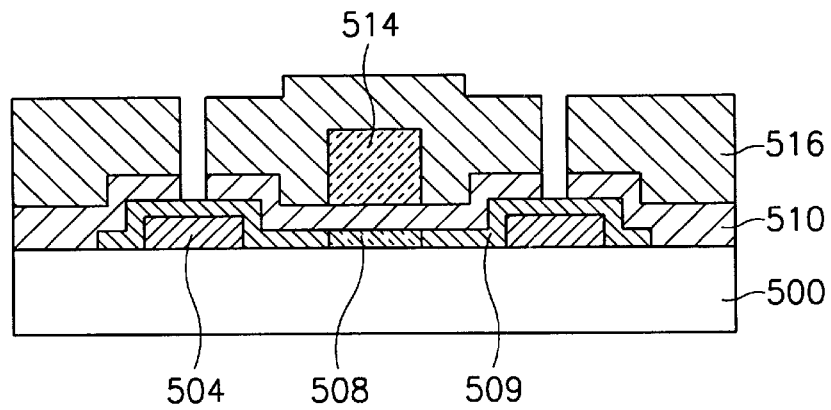
Figure 19K:
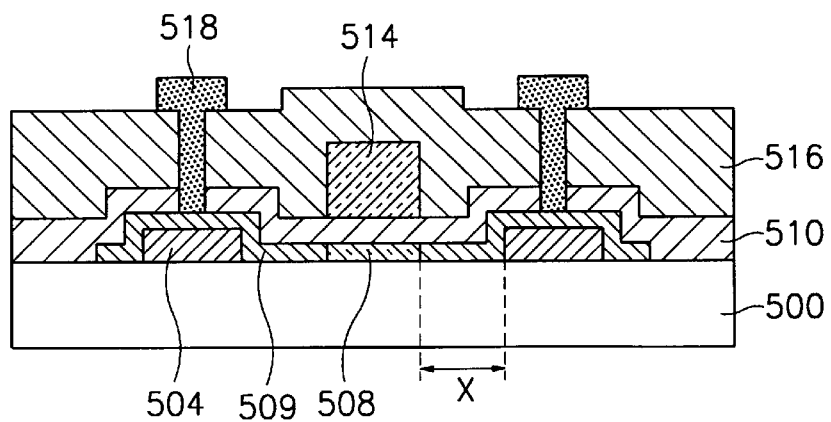

As shown in FIG. 19J, contact holes are formed by etching the insulating layer 516 so that, as shown in FIG. 19K, a metal 518 made of Al can be deposited in the contact holes and over the remaining surface with a thickness of about 6000 A and etched to form a patterned metal layer 518.

The characteristics of the TFT as the distance between the seed layer 504 and the laser crystallized active region 508 become shorter.

Thus, this invention is able to crystallize an active portion of a semiconductor layer by positioning a seed layer in a desired position. The grain size of the silicon layer formed according to the present invention is 3–5 times as large as a grain size of a silicon layer formed by conventional methods.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for manufacturing a portion of a thin film transistor liquid crystal display including an active region comprising the steps of:

depositing a seed layer on a substrate;

forming a seed layer pattern by etching said seed layer;

epitaxially growing a silicon layer over said seed layer pattern and over portions of said substrate;

implanting ions in said silicon layer to obtain an ion implanted silicon layer; and annealing said ion implanted silicon layer to obtain said active region of said thin film transistor liquid crystal display, wherein said step of forming said seed layer pattern forms said seed layer pattern in a position that corresponds to a location between source and drain electrodes in said active region of said thin film transistor liquid crystal display.

2. A method for manufacturing a portion of a thin film transistor liquid crystal display including an active region comprising the steps of:

depositing a seed layer on a substrate;

forming a seed layer pattern by etching said seed layer;

epitaxially growing a silicon layer over said seed layer pattern and over portions of said substrate;

implanting ions in said silicon layer to obtain an ion implanted silicon layer;

annealing said ion implanted silicon layer to obtain said active region of said thin film transistor liquid crystal display;

forming an oxidation layer over said active region of said thin film transistor liquid crystal display;

depositing a gate metal over said oxidation layer;

forming a gate pattern by etching said gate metal;

depositing an insulating layer over said gate pattern;

etching contact holes in portions of said oxidation layer and said insulating layer; and forming a conductor layer connected through said contact holes to portions of said active region of said thin film transistor liquid crystal display, wherein said step of forming said seed layer pattern forms said seed layer pattern below a location of at least one of source and drain electrodes in said active region of said thin film transistor liquid crystal display.

3. A method according to claim 2 further including the step of annealing said active region of said thin film transistor liquid crystal display after forming said oxidation layer.

4. A method according to claim 3 wherein said step of annealing said active region of said thin film transistor liquid crystal display after forming said oxidation layer uses an annealing temperature in the range of 800°–1100° C.

5. A method for manufacturing a portion of a thin film transistor liquid crystal display including an active region comprising the steps of:

forming a trench by etching a substrate;

depositing a silicon layer over said substrate and into said trench;

annealing said silicon layer so that grains within said silicon layer become larger;

etching said silicon layer to form a active region silicon layer pattern.

6. A method according to claim 5 wherein said step of forming said trench forms said trench in a position that corresponds to a location of at least one of a source and drain electrode in said active region of said thin film transistor liquid crystal display.

7. A method according to claim 6 wherein said trench is positioned below one of said source and drain electrodes.

8. A method according to claim 7 wherein said trench is positioned between said source and drain electrodes.

9. A method for manufacturing a portion of a thin film transistor liquid crystal display including an active region comprising the steps of:

depositing an amorphous silicon layer on a substrate;

transforming said amorphous silicon to a poly silicon layer using solid phase crystallization;

etching said poly silicon layer to form a seed layer pattern;

depositing another amorphous silicon layer over said seed layer pattern and portions of said substrate; and transforming said another amorphous silicon layer into said active region using solid phase crystallization.

10. A method according to claim 9 wherein said step of forming said seed layer pattern forms said seed layer pattern in a position that corresponds to a location of at least one of a source and drain electrode in said active region of said thin film transistor liquid crystal display.

11. A method according to claim 10 wherein said seed layer pattern is positioned below one of said source and drain electrodes.

12. A method according to claim 10 wherein said seed layer pattern is positioned between said source and drain electrodes.

13. A method for manufacturing a portion of a thin film transistor liquid crystal display comprising the step of:

forming a seed layer pattern of amorphous silicon on a substrate;

depositing an amorphous silicon active layer over said seed layer pattern and portions of said substrate; and projecting a laser on a part of said amorphous silicon layer to melt portions of said amorphous silicon layer that are adjacent to said seed layer pattern to form a laser crystallized region.

14. A method according to claim 13, further including the steps of:

etching said laser crystallized region to define a laser crystallized active region;

depositing a gate insulating layer over said laser crystallized active region;

forming a gate electrode over said gate insulating layer;

forming a source and drain electrodes in said laser crystallized active region using said gate electrode as a mask;

depositing an insulating layer over exposed surface portions;

etching said insulating layer to form contact holes in said insulating layer to expose said source and drain electrodes; and forming a metal pattern over said insulating layer, said metal pattern filling said contact holes and establishing electrical contact with said source and drain electrodes.

* * * * *